(12) United States Patent
Koh et al.

(10) Patent No.: US 12,424,412 B2
(45) Date of Patent: Sep. 23, 2025

(54) APPARATUS FOR PROVIDING RF POWER AND OPERATING METHOD THEREOF

(71) Applicant: Samsung Electronics Co., Ltd., Suwon-si (KR)

(72) Inventors: Siyoung Koh, Suwon-si (KR); Hadong Jin, Suwon-si (KR); Namkyun Kim, Suwon-si (KR); Seungbo Shim, Suwon-si (KR); Sungyong Lim, Suwon-si (KR); Sungyeol Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 183 days.

(21) Appl. No.: 18/344,307

(22) Filed: Jun. 29, 2023

(65) Prior Publication Data

US 2024/0304420 A1 Sep. 12, 2024

(30) Foreign Application Priority Data

Mar. 10, 2023 (KR) ........................ 10-2023-0031570

(51) Int. Cl.
*H01J 37/32* (2006.01)
*G01R 27/16* (2006.01)

(52) U.S. Cl.
CPC ........ *H01J 37/32183* (2013.01); *G01R 27/16* (2013.01); *H01J 37/32926* (2013.01); *H01J 37/32935* (2013.01)

(58) Field of Classification Search
None
See application file for complete search history.

(56) References Cited

U.S. PATENT DOCUMENTS

| | | | | |
|---|---|---|---|---|
| 5,556,549 A | * | 9/1996 | Patrick | H05H 1/46 118/712 |
| 5,688,357 A | * | 11/1997 | Hanawa | H01J 37/32082 156/345.48 |
| 6,020,794 A | | 2/2000 | Wilbur | |
| 7,122,965 B2 | * | 10/2006 | Goodman | H01J 37/32935 315/111.21 |
| 7,292,047 B2 | * | 11/2007 | Tanaka | H01J 37/32935 324/76.19 |
| 7,489,206 B2 | * | 2/2009 | Kotani | H03H 7/40 315/111.21 |
| 8,073,646 B2 | * | 12/2011 | Sato | H01J 37/32082 118/712 |
| 8,674,606 B2 | * | 3/2014 | Carter | H01J 37/32935 315/111.21 |
| 8,716,939 B2 | | 5/2014 | Utano et al. | |
| 9,059,680 B2 | * | 6/2015 | Shimomoto | H03H 7/40 |
| 9,088,267 B2 | * | 7/2015 | Blackburn | H01J 37/32183 |

(Continued)

FOREIGN PATENT DOCUMENTS

JP 6922069 B2 7/2021

*Primary Examiner* — Kenneth B Wells
(74) *Attorney, Agent, or Firm* — Wolf, Greenfield & Sacks, P.C.

(57) ABSTRACT

An apparatus for providing radio frequency (RF) power includes a load having a process chamber, a RF power generator configured to provide the RF power through a cable electrically connected to the load, and a reflected power controller configured to detect reflected power from the load in a delivery mode and configured to control the RF power according to the reflected power that was detected.

13 Claims, 4 Drawing Sheets

(56) References Cited

U.S. PATENT DOCUMENTS

| | | | | |
|---|---|---|---|---|
| 9,119,283 B2* | 8/2015 | Albarede | .......... | H01J 37/32899 |
| 9,386,680 B2* | 7/2016 | Chen | ................ | H01J 37/32082 |
| 9,462,672 B2* | 10/2016 | Valcore, Jr. | ........ | H01J 37/32174 |
| 9,594,105 B2* | 3/2017 | Howald | ................. | G01R 27/06 |
| 10,395,895 B2* | 8/2019 | Coumou | ........... | H01J 37/32155 |
| 10,971,335 B2* | 4/2021 | Kim | ...................... | H01J 37/321 |
| 11,139,148 B2 | 10/2021 | Van Zyl | | |
| 11,521,831 B2* | 12/2022 | Ulrich | ..................... | H03H 7/38 |
| 11,804,362 B2* | 10/2023 | Van Zyl | ............ | H01J 37/32183 |
| 11,996,274 B2* | 5/2024 | Martinez | ............. | H01J 37/3299 |
| 12,002,653 B2* | 6/2024 | Evans | ............... | H01J 37/32174 |
| 12,205,796 B2* | 1/2025 | Kapoor | ............. | H01L 21/02274 |
| 2005/0057165 A1 | 3/2005 | Goodman | | |
| 2022/0238307 A1 | 7/2022 | Evans et al. | | |

* cited by examiner

APPARATUS FOR PROVIDING RF POWER AND OPERATING METHOD THEREOF

CROSS-REFERENCE TO RELATED APPLICATION(S)

This application claims benefit of priority to Korean Patent Application No. 10-2023-0031570 filed on Mar. 10, 2023 in the Korean Intellectual Property Office, the disclosure of which is incorporated herein by reference in its entirety.

BACKGROUND

The present inventive concept relates to an apparatus for providing RF power and an operating method thereof.

In general, plasma is generated by applying radio frequency (RF) power as an energy source. A capacitively coupled plasma (CCP) method of generating plasma by applying RF power between facing parallel plates is provided. An inductively coupled plasma (ICP) method of generating plasma by applying RF power to a coil outside the reaction tube is also provided.

SUMMARY

Some embodiments of the present inventive concept is to provide an apparatus for providing RF power, capable of compensating for reflected power, and an operating method thereof.

According to some embodiments of the present inventive concept, an apparatus configured to provide radio frequency (RF) power includes a load having a process chamber, an RF power generator configured to provide RF power through a cable electrically connected to the load, and a reflected power controller configured to detect reflected power from the load in a delivery mode and configured to control the RF power according to the reflected power that was detected.

According to some embodiments of the present inventive concept, an apparatus configured to provide radio frequency (RF) power includes a load input sensor configured to detect a first RF power of a cable electrically connected to a load, a generator output sensor configured to detect a second RF power of a cable electrically connected to a radio frequency (RF) power generator, and a control logic configured to generate control data corresponding to a difference between the first RF power and the second RF power. The control logic includes a processor configured to execute reflected power control operations and a memory device configured to store the reflected power control operations. The reflected power control operations are configured to receive the first RF power and the second RF power in a delivery mode, configured to compare the first RF power with the second RF power, and configured to generate the control data for controlling RF power according to the difference between the first RF power and the second RF power.

According to some embodiments of the present inventive concept, an operating method of a radio frequency (RF) power providing apparatus includes determining one or more load characteristics in a user-defined load, outputting radio frequency (RF) power from an RF power generator to the user-defined load, comparing an output sensor value from the RF power generator with an input sensor value of the user-defined load, applying an attenuation ratio corresponding to a cable loss value based on the output sensor value and the input sensor value to reflected power from the user-defined load, and applying an RF calibration value corresponding to the attenuation ratio to satisfy the one or more load characteristics in the RF power generator.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

In general, a semiconductor/display process using plasma essentially uses a power supply device to supply energy to charged particles. Depending on a plasma generating method, the specifications of the power supply device in use are slightly different. In the case of inductively coupled plasma (ICP), an alternating current power supply device is used. Most of these power supply devices are high-frequency power supply devices within a range of hundreds of kHz to several tens of MHz. In order to supply power to a plasma generating device using these high-frequency power supply devices, a radio frequency (RF) power supply device generating power and an impedance matching network effectively transferring the generated power to a load have been used. In particular, the impedance matching network is manufactured to fit electrical characteristics of process equipment and is able to be continuously controlled for optimal power delivery according to the impedance of plasma that changes according to process conditions.

Generally, there are two delivery modes for providing power from an RF power generator to a process chamber. The first mode is a direct delivery mode, where power is supplied directly from the RF power generator to the process chamber. This method is straightforward and has low power loss. However, since a cable connects the RF power generator and the process chamber, the length, material, and arrangement of the cable significantly influence the delivery efficiency. The second mode is a transmission delivery mode, where RF power is conveyed using an appropriate transmission line between the RF power generator and the process chamber. This mode offers higher delivery efficiency than the direct delivery mode, and this efficiency can be optimized or improved by adjusting the length, material, and arrangement of the transmission circuit. Typically, the choice of delivery mode is determined by considering several factors, such as the distance between the RF power generator and the process chamber, the magnitude of power, and/or delivery efficiency.

A plasma providing apparatus and an operating method thereof, according to some embodiments of the present inventive concept, may control the generation of RF power through a controller. This controller addresses power errors that occur when comparing sensor values at various respective locations after determining load characteristics in the delivery mode. The plasma providing apparatus and the operating method may deliver more accurate RF power to a facility by calibrating the reflected power, which inevitably exists in the facility, using the transmission delivery mode. Therefore, this inventive concept is particularly suitable for tool-to-tool matching (TTTM).

Figure 1:
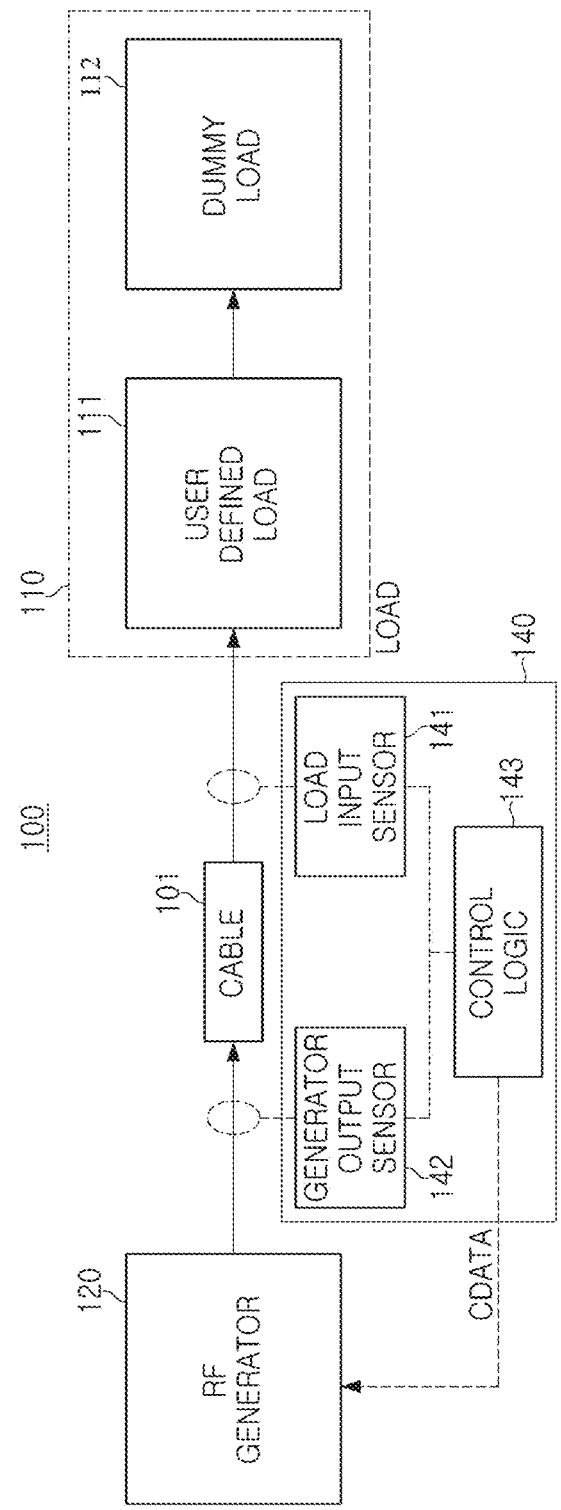
FIG. 1 is a diagram illustrating an apparatus for providing RF power according to some embodiments of the present inventive concept.

FIG. 1 is a diagram illustrating an apparatus for providing RF power (or an RF power providing apparatus) 100 according to some embodiments of the present inventive concept. Referring to FIG. 1, the RF power providing apparatus 100 may include a load 110, an RF power generator 120, and a reflected power controller 140. The RF power providing apparatus 100 may be implemented to compensate for reflected power generated in the delivery mode. Here, the delivery mode refers to detecting reflected power and outputting as much RF power as the detected reflected power.

The load 110 may include a facility. The load 100 may include a user-defined load 111 and a dummy load 112. The user-defined load 111 may be a load corresponding to a process chamber. The dummy load 112 may have a 50Ω impedance to minimize a reflected wave signal.

The RF power generator 120 may be implemented to generate RF power to be provided to the load 110 through a cable 101. For example, the RF power generator 120 may generate and output RF power having a frequency ranging from several MHz to several tens of MHz. Meanwhile, it should be understood that the frequency of the RF power generated by the RF power generator 120 is not limited to the range of several MHz to several tens of MHz.

In some embodiments, the cable 101 may include a coaxial cable. Here, the coaxial cable may include a center conductor, an outer conductor, an insulator, and an outer sheath. The coaxial cable may have a structure in which the center conductor and the outer conductor are coaxially arranged. Meanwhile, the insulator fills or is between the center conductor and the outer conductor, and may be formed of, for example, polyethylene. The coaxial cable may deliver RF power having frequencies ranging from a few MHz to several tens of MHz.

The reflected power controller 140 may be implemented to detect reflected power and increase/decrease RF power according to the detected reflected power. The reflected power controller 140 may include a load input sensor 141, a generator output sensor 142, and control logic 143.

The load input sensor 141 ('a first RF sensor') may be implemented to detect first RF power in a load terminal. For example, the load input sensor 141 may detect the first RF power at the load terminal by measuring voltage, current, or impedance corresponding to an RF signal of the cable 101 near the load 110.

The generator output sensor 142 ('a second RF sensor') may be implemented to detect second RF power at an output terminal. For example, the generator output sensor 142 may detect the second RF power at the output terminal by measuring a voltage, current, and impedance corresponding to the RF signal of the cable 101 near the RF power generator 120.

In some embodiments, the load input sensor 141 and the generator output sensor 142 may detect at least one RF parameter related to forward power or reflected power according to a voltage standing wave ratio (VSWR) situation.

The control logic 143 may be implemented to generate control data CDATA corresponding to a difference between the first RF power of the load input sensor 141 and the second RF power of the generator output sensor 142. Here, the RF power of the RF power generator 120 in the delivery mode may be determined according to the control data CDATA.

The control logic 143 may also include a processor and a memory device. The processor may be implemented to execute a reflected power control module or reflected power control operations that may be embodied as code or software operations, firmware operations, and/or hardware operations. Here, the processor may be implemented as an application specific integrated circuit (ASIC), a programmable logic device (PLD), a central processing unit (CPU), or a microprocessor. The memory device may be implemented to store the reflected power control module or reflected power control operations. Here, the memory device may be implemented as a read only memory (ROM), random access memory (RAM), a redundant array of storage disks, a hard disk, or a flash memory device. In some embodiments, the reflected power control module or reflected power control operations may receive the first RF power from the load input sensor 141 and the second RF power from the generator output sensor 142 in the delivery mode, compare the first RF power with the second RF power, and generate the control data CDATA for controlling RF power according to a difference between the first RF power and the second RF power.

In some embodiments, the control logic 143 may determine load characteristics of the user-defined load 111. Here, the load characteristics may be a voltage standing wave ratio (VSWR). In some embodiments, the control logic 143 may calibrate the reflected power by creating a reflected power generating environment through the user-defined load 111. In some embodiments, the control logic 143 may perform forward power calibration by calculating or determining an attenuation ratio of the cable 101.

Meanwhile, the reflected power controller 140 may be activated in TTTM for matching between facilities.

A general legacy RF power providing apparatus receives predetermined calibration data and performs a control operation suitable for a plasma vessel state. Such an RF power providing apparatus applies control data suitable for an impedance value of the plasma vessel, which varies according to process conditions, to the RF power generator. However, since the calibration data is applied only to specific load information, the general RF power providing apparatus cannot respond to other load conditions. Therefore, the general RF power providing apparatus has low versatility and cannot guarantee accuracy of the reflected power.

In contrast, the RF power providing apparatus 100 according to some embodiments of the present inventive concept may control the RF power generator 120 through the control logic 143 using power errors (differences) generated by comparing values of the sensors 141 and 142 for each position, after determining the load characteristics through the user-defined load 111.

The RF power providing apparatus 100 may measure the RF power output from the RF power generator 120 at each position using sensors 141 and 142. It can calculate or determine the attenuation ratio of the cable 101 and enable forward power calibration according to this ratio. Additionally, the RF power providing apparatus 100 facilitates reflected power calibration by creating a reflected power environment through the user-defined load 111. In other words, the RF power providing apparatus 100 may enable forward power calibration through the two sensors 141 and 142, calibrate reflected power universally regardless of load conditions, and adjust the reflected power through a cable loss value and sensor readings at each position.

Figure 2A:
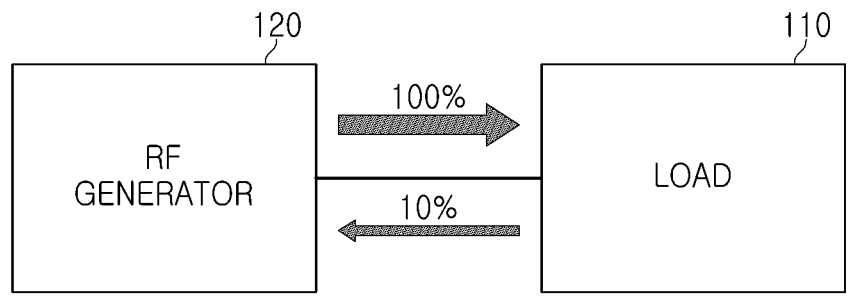
FIGS. 2A and 2B are diagrams illustrating power delivery of an apparatus for providing RF power according to some embodiments of the present inventive concept.
Figure 2B:
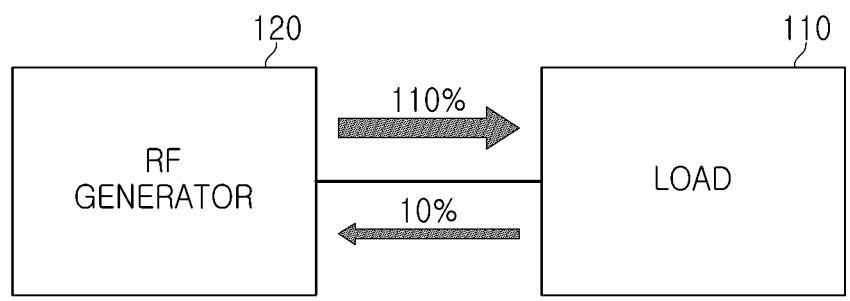

FIGS. 2A and 2B are diagrams illustrating power delivery of the RF power providing apparatus 100 according to some embodiments of the present inventive concept. Referring to FIG. 2A, in a normal power delivery mode, the RF power generator 120 may output 100% of RF power to the cable connected to the load 110. At this time, the load 110 may reflect 10% of reflected power to the cable. As a result, the RF power generator 120 may transmit 90% of the RF power to the load 110. Referring to FIG. 2B, in the transmission delivery mode, the RF power generator 120 may output 110% of the RF power to the cable after detecting predetermined reflected power. In this case, although the load 110 reflects 10% of the reflected power to the cable, the load 110 may receive 100% of the RF power. In other words, the RF power generator 120 is configured to output a greater amount of RF power to compensate for the reflected power.

In general, as the etching process becomes more sophisticated, power applied to the equipment increases in order to more deeply etch a wafer. As the applied power increases, the magnitude of reflected power inevitably increases in equipment using the delivery mode. The increase in reflected power results in a decrease in power delivered to the facility. The increase or decrease has become a major factor that causes variation between facilities. In particular, since RF power is a factor that directly affects an etching rate (E/R), it is important to equally deliver accurate RF power to facilities to improve the health of facilities.

The general RF power generator performs forward power calibration to compensate for cable loss. However, such forward power calibration does not calibrate reflected power from the facility. This may lead to a situation in which each facility does not receive accurate RF power therefor. Meanwhile, the RF power providing apparatus 100 according to some embodiments of the present inventive concept may compensate for reflected power in the delivery mode in order to improve a variation between facilities and the health of facilities.

Figure 3:
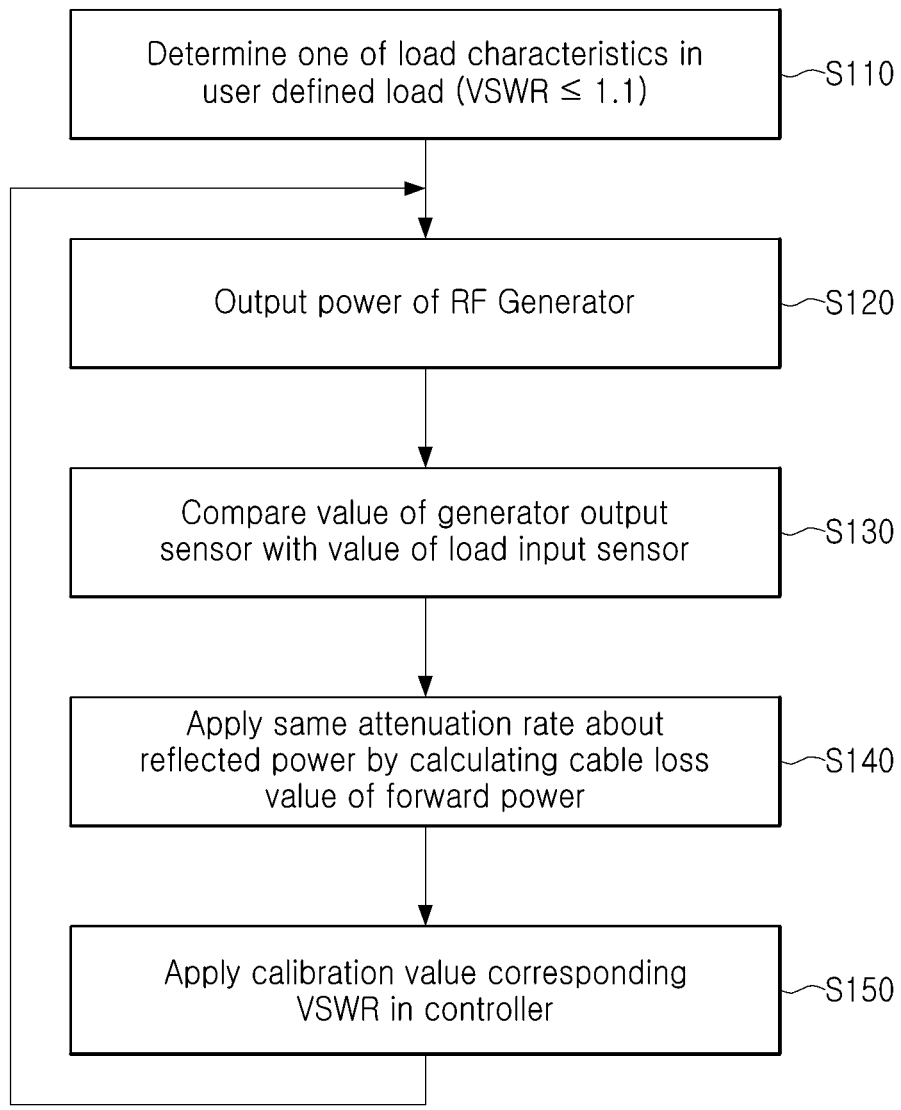
FIG. 3 is a flowchart illustrating an operating method of an apparatus for providing RF power according to some embodiments of the present inventive concept.

FIG. 3 is a flowchart illustrating an operating method of the RF power providing apparatus 100 according to some embodiments of the present inventive concept. Referring to FIGS. 1 to 3, operation of the RF power providing apparatus 100 may be performed as follows.

One or more of the load characteristics of the user-defined load 111 corresponding to a facility may be determined (S110). Here, the determined load characteristic may be a value related to a VSWR, for example. In some embodiments, the VSWR may be determined to be 1.1 or less. In general, the VSWR refers to a maximum allowed reflected power to output RF power. Power of the RF power generator 120 may be output (S120). RF power values between the generator output sensor 142 and the load input sensor 141 may be compared (S130). By calculating a cable loss value of forward power, the same attenuation ratio for the reflected power may be applied (S140). A calibration value corresponding to the VSWR may be applied from the reflected power controller 140 to the RF power generator 120 (S150).

In some embodiments, an output sensor value of the generator output sensor 412 and an input sensor value of the load input sensor 141 may be detected in the delivery mode. In some embodiments, a cable loss value according to the output sensor value and the input sensor value may be calculated or determined. In some embodiments, the RF calibration value may be determined to satisfy the VSWR determined as the load characteristic. For example, the RF calibration value may be equal to or be a multiple of the attenuation ratio.

Meanwhile, the RF power providing apparatus according to some embodiments of the present inventive concept is applicable to a plasma generating device.

Figure 4:
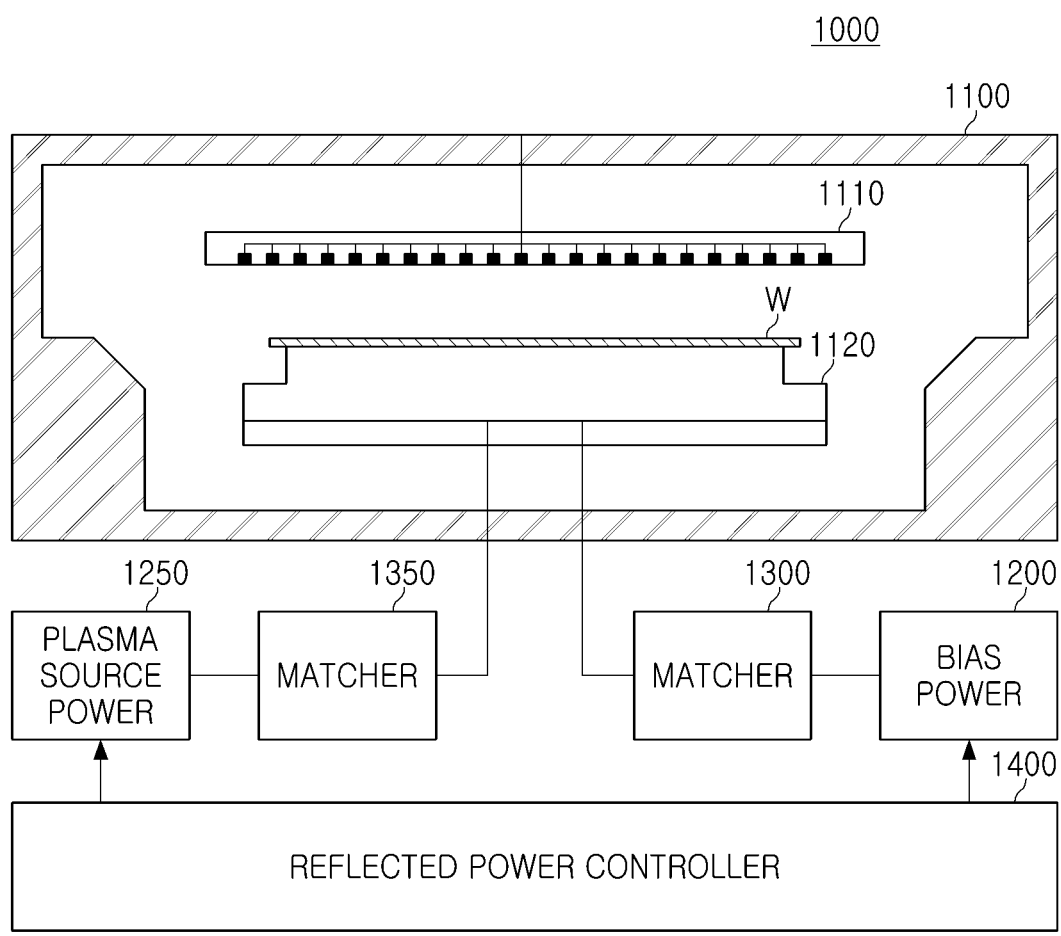
FIG. 4 is a diagram illustrating a plasma generating device according to some embodiments of the present inventive concept.

FIG. 4 is a diagram illustrating a plasma generating device 1000 according to some embodiments of the present inventive concept by way of example. Referring to FIG. 4, the plasma generating apparatus 1000 may include a process chamber 1100, a bias generator (or bias power) 1200, a plasma source generator (or plasma source power) 1250, a first matcher 1300, a second matcher 1350, and a reflected power controller 1400.

The process chamber 1100 may include a chamber body, an electrostatic chuck, and a shower head. The process chamber 1100 is a chamber for a plasma process and is also referred to as a plasma reactor chamber. The process chamber 1100 may be a capacitively coupled plasma (CCP) chamber, an inductively coupled plasma (ICP) chamber, or a combination chamber including the CCP and ICP chambers. Meanwhile, it should be understood that the process chamber of the present inventive concept is not limited thereto. The process chamber 1110 of the present inventive concept may be various types of chambers, such as an electron cyclotron resonance (ECR) plasma chamber, a surface wave plasma (SWP) chamber, a helicon wave plasma chamber, and/or an e-beam plasma chamber.

The chamber body may limit a reaction space in which plasma is formed to seal the reaction space from the outside. In general, the chamber body is formed of a metal material and may maintain a grounded state to block noise from the outside during a plasma process. An insulating liner may be disposed inside the chamber body. The insulating liner may protect the chamber body and cover, overlap, or be on metal structures protruding from the chamber body to prevent arcing inside the plasma chamber 400. Meanwhile, although not shown, a gas inlet, a gas outlet, and a viewing-port may be formed in the chamber body. A process gas required for a plasma process may be supplied through the gas inlet. Here, the process gas may refer to all gases required in a plasma process, such as a source gas, a reaction gas, and a purge gas. After the plasma process, gases inside the plasma chamber may be exhausted to the outside through the gas outlet. Also, the pressure inside the plasma chamber may be controlled through the gas outlet. Meanwhile, one or more viewing-ports may be formed in the chamber body, and the inside of the plasma chamber may be monitored through the viewing-port.

In addition, the process chamber 1100 may include an upper electrode 1110, a lower electrode 1120, and a plasma and process gas supply unit. The upper electrode 1110 may be disposed in an upper portion of a vacuum container, and the lower electrode 1120 may be disposed in a lower portion of the vacuum container. The lower electrode 1120 may be disposed below the upper electrode 1110. RF power (or pulse) generated by the upper electrode 1110 or the lower electrode 1120 may be combined with plasma. In some embodiments, the upper electrode 1110 or the lower electrode 1120 may inductively couple power to process gases supplied to the inside of the vacuum container by the process gas supply unit. RF power applied by either the upper electrode 1110 or the lower electrode 1120 may be inductively coupled to process gases to form a plasma in a reaction region on a semiconductor wafer substrate. The process gases supplied from the process gas supply unit may etch materials on the semiconductor wafer substrate. In some embodiments, the process gases may include CxFy. In some embodiments, RF power applied from the upper electrode 1110 ignites plasma, and RF power applied from the lower electrode 1120 may control ions, radicals, and the like of the plasma.

The bias generator 1200 may be implemented to generate a bias pulse for minimizing reflected power from the process chamber 1100. The bias generator 1200 may equally match impedance of the process chamber 1100 and impedance of the plasma source generator 1250 to minimize reflected power. In some embodiments, complex impedance of the process chamber 1100 and complex impedance of the bias generator 1200 may be matched to 50Ω. In some embodiments, the bias generator 1200 may be implemented to match an input impedance corresponding to an RF pulse to a plasma load in real time.

The plasma source generator 1250 may be implemented to generate high frequency pulses (e.g., RF pulses). In some embodiments, the high frequency pulse may be a single-level pulse or a multi-level pulse. For example, the plasma source generator 1250 may generate RF pulses using a desired phase, delay, or duty cycle between pulses of a microwave power generator and RF frequency power generators. Meanwhile, it should be understood that the generating of RF pulses of the present inventive concept is not limited thereto. The RF pulse of the present inventive concept may be generated by at least one of an RF power generator, a mid-frequency (MF) generator, a high frequency (HF) generator, or a very high frequency (VHF) generator. Also, the plasma source generator 1250 may include a pulse controller. The pulse controller may be implemented to control a desired phase, delay, or duty cycle of pulses of a microwave source power generator and RF bias power generators.

The first matcher 1300 may be implemented to adjust impedance for impedance matching corresponding to the bias generator 1200. The second matcher 1350 may be implemented to adjust impedance for impedance matching of the plasma source generator 1250. The first and second matchers 1300 and 1350 may adjust impedance so that RF power from the RF power generators 1200 and 1250 may be transferred to the process chamber 1100 at the maximum. For example, each of the matchers 1300 and 1350 may adjust impedance so that a complex conjugate condition is satisfied based on maximum power delivery theory. That is, each of the matchers 1300 and 1350 may minimize reflected power by driving the RF power generators 1200 and 1250 in an environment of 50Ω.

The reflected power controller 1400 may be implemented to control RF power output from at least one of the bias generator 1200 and the plasma source generator 1250. As described in FIGS. 1 to 3, the reflected power controller 1400 may be implemented to detect reflected power when RF power is provided to the process chamber 1100, and provide the RF power to the process chamber 1100 in real time in response to the detected reflected power.

The apparatus described above may be implemented as hardware components, software components, and/or a combination of hardware components and software components. For example, devices and components described in the embodiments may be implemented using one or more general-purpose computers or special-purpose computers, like processors, controllers, arithmetic logic units (ALU), digital signal processors (DSPs), microcomputers, field programmable gate arrays (FPGA), programmable logic units (PLUs), microprocessors, or any other devices that may execute instructions and respond to instructions. The processing device may run an operating system (OS) and one or more software applications running on the operating system. The processing device may also access, store, operate, process, and generate data in response to execution of software. For convenience of understanding, there are cases in which one processing device is used, but those skilled in the art will understand that the processing device includes a plurality of processing elements or a plurality of types of processing elements. For example, a processing device may include a plurality of processors or a processor and a controller. Other processing configurations, such as parallel processors, may also be implemented.

The present inventive concept is a technology applied to a target facility that uses an RF power generator. It may include a method and configuration for compensating for reflected power in a facility using a delivery mode, in order to accurately deliver RF power to that facility. In some embodiments, when an RF signal is output from an output port of the RF power generator to an input port of the user-defined load, capable of changing the VSWR condition of a load, two sensors located at the output port of the RF power generator and the input port of the user-defined load may perform one or more types of RF parameter sensing related to forward/reflected power according to a VSWR situation. A computing unit (or a controller), capable of controlling the generator, calculates or generates calibration data based on the sensed RF parameter value and delivers a calibration value appropriate to the VSWR situation to the generator to perform control, thereby achieving reflected power calibration.

The RF power providing method, in accordance with some embodiments of the present inventive concept, is applicable to RF power generators included in all facilities that use the delivery mode. Therefore, this inventive method may deliver accurate RF power to the facility by compensating for the reflected power that was not accounted for in the related art. This accurate delivery of RF power may reduce variations between facilities. Consequently, it may lead to improvements in process distribution due to reduced RF power non-uniformity.

The RF power providing apparatus and the operating method may compensate for a power error by comparing sensor values at each location, taking into account the load characteristics of each facility.

While example embodiments have been illustrated and described above, it will be apparent to those skilled in the art that modifications and variations could be made without departing from the scope of the present inventive concept as defined by the appended claims.

What is claimed is:

1. An apparatus configured to provide radio frequency (RF) power, the apparatus comprising:
   a load comprising a process chamber;
   an RF power generator configured to provide the RF power through a cable electrically connected to the load; and
   a reflected power controller configured to detect reflected power from the load in a delivery mode and configured to control the RF power according to the reflected power that was detected,
   wherein the load further comprises:
   a user-defined load corresponding to the process chamber; and
   a dummy load having impedance that is configured to reduce the reflected power,
   wherein the user-defined load is between the dummy load and the cable, wherein the user-defined load produces a voltage standing wave ratio (VSWR) of 1.1 or less, and wherein the reflected power controller is further configured to output control data for calibrating the reflected power according to the VSWR associated with the user-defined load.

2. The apparatus of claim 1, wherein the cable includes a coaxial cable.

3. The apparatus of claim 1, wherein the reflected power controller comprises:
   a load input sensor configured to detect a first RF power that is input to the load;
   a generator output sensor configured to detect a second RF power that is output from the RF power generator; and
   a control logic configured to generate control data corresponding to a difference between the first RF power and the second RF power.

4. The apparatus of claim 3, wherein the load input sensor and/or the generator output sensor measure a voltage, a current, and/or impedance corresponding to an RF signal transmitted through the cable.

5. The apparatus of claim 3, wherein the control logic is configured to determine a forward power cable loss value corresponding to the difference between the first RF power and the second RF power and configured to generate the control data for applying an attenuation ratio of an equal ratio as the reflected power.

6. The apparatus of claim 1, wherein the RF power generator is configured to calibrate the RF power in response to control data.

7. The apparatus of claim 1, wherein the reflected power controller is configured to be activated in tool-to-tool matching (TTTM).

8. An apparatus configured to provide radio frequency (RF) power, the apparatus comprising:
   a load input sensor configured to detect a first RF power of a cable that is electrically connected to a load;
   a generator output sensor configured to detect a second RF power of the cable electrically connected to an RF power generator; and
   a control logic configured to generate control data corresponding to a difference between the first RF power and the second RF power,
   wherein the control logic includes a processor configured to execute reflected power control operations and a memory device configured to store the reflected power control operations,
   wherein the reflected power control operations include receiving the first RF power and the second RF power in a delivery mode, comparing the first RF power with the second RF power, and generating the control data for controlling RF power according to the difference between the first RF power and the second RF power,
   wherein the load includes a user-defined load and a dummy load having impedance that is configured to reduce reflected power,
   wherein the user-defined load is between the dummy load and the cable,
   wherein the control logic is configured to determine load characteristics of the user-defined load,
   wherein the load input sensor and the generator output sensor are configured to detect at least one RF parameter related to forward power or the reflected power according to a voltage standing wave ratio (VSWR) of 1.1 or less, and
   wherein the control logic is configured to calibrate the reflected power by creating a reflected power generating environment through the user-defined load by calibrating the reflected power according to the VSWR.

9. The apparatus of claim 8, wherein the control logic is configured to perform forward power calibration by determining an attenuation ratio of the cable.

10. An apparatus configured to provide radio frequency (RF) power, the apparatus comprising a processor, wherein the processor executes a program to perform operations comprising:
    determining one or more load characteristics in a user-defined load and a dummy load having impedance that is configured to reduce reflected power;
    outputting RF power from an RF power generator to the user-defined load;
    comparing an output sensor value from the RF power generator with an input sensor value of the user-defined load;
    applying an attenuation ratio corresponding to a cable loss value of a cable based on the output sensor value and the input sensor value to reflected power from the user-defined load;
    applying an RF calibration value corresponding to the attenuation ratio to satisfy the one or more load characteristics in the RF power generator; and
    calibrating the reflected power by creating a reflected power generating environment through the user-defined load by calibrating the RF calibration value according to a voltage standing wave ratio (VSWR),
    wherein the user-defined load is between the dummy load and the cable,
    wherein the user-defined load has the VSWR of 1.1 or less.

11. The apparatus of claim 10, wherein the one or more load characteristics are related to the VSWR.

12. The apparatus of claim 10, wherein the comparing includes detecting the output sensor value and the input sensor value in a delivery mode.

13. The apparatus of claim 10, wherein the applying of the attenuation ratio includes determining the cable loss value based on the output sensor value and the input sensor value.

* * * * *